(12) United States Patent
Joi et al.

(10) Patent No.: US 10,640,874 B2
(45) Date of Patent: May 5, 2020

(54) SELECTIVE ELECTROLESS ELECTROCHEMICAL ATOMIC LAYER DEPOSITION IN AN AQUEOUS SOLUTION WITHOUT EXTERNAL VOLTAGE BIAS

(71) Applicant: LAM RESEARCH CORPORATION, Fremont, CA (US)

(72) Inventors: Aniruddha Joi, San Jose, CA (US); Kailash Venkatraman, Sunnyvale, CA (US); Yezdi Dordi, Palo Alto, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 16/054,428

(22) Filed: Aug. 3, 2018

(65) Prior Publication Data

US 2019/0048472 A1 Feb. 14, 2019

Related U.S. Application Data

(60) Provisional application No. 62/545,180, filed on Aug. 14, 2017.

(51) Int. Cl.
*C23C 18/16* (2006.01)
*C23C 16/455* (2006.01)
(Continued)

(52) U.S. Cl.
CPC .... *C23C 18/1619* (2013.01); *C23C 16/45525* (2013.01); *C23C 18/02* (2013.01);
(Continued)

(58) Field of Classification Search
CPC ...... C23C 18/1619; C23C 18/54; C23C 18/52; C23C 18/1632; C23C 18/44; C23C 18/08; C23C 18/1675; C23C 18/34
(Continued)

(56) References Cited

U.S. PATENT DOCUMENTS

| 2003/0141018 A1 | 7/2003 | Stevens et al. |
| 2015/0225679 A1 | 8/2015 | Kolics et al. |
| 2016/0138166 A1 | 5/2016 | Yoon et al. |

OTHER PUBLICATIONS

Ambrozik, The deposition of Pt via electroless surface limited redox replacement, 2015, Electrochimica Acta, 169, p. 248-255 (Year: 2015).*

(Continued)

*Primary Examiner* — Dah-Wei D. Yuan
*Assistant Examiner* — Nga Leung V Law

(57) ABSTRACT

A method of performing electroless electrochemical atomic layer deposition is provided and includes: providing a substrate including an exposed upper metal layer; exposing the substrate to a first precursor solution to create a sacrificial metal monolayer on the exposed upper metal layer via underpotential deposition, where the first precursor solution is an aqueous solution including a reducing agent; subsequent to the forming of the sacrificial metal monolayer, rinsing the substrate; subsequent to the rinsing of the substrate, exposing the substrate to a second precursor solution to replace the sacrificial metal monolayer with a first deposition layer; and subsequent to replacing the sacrificial metal monolayer with the first deposition layer, rinsing the substrate. The exposure of the substrate to the first precursor solution and the exposure of the substrate to the second precursor solution are electroless processes.

20 Claims, 7 Drawing Sheets

(51) Int. Cl.

| | |
|---|---|
| *C23C 18/54* | (2006.01) |
| *C23C 18/40* | (2006.01) |
| *C23C 18/08* | (2006.01) |
| *C23C 18/34* | (2006.01) |
| *C23C 18/52* | (2006.01) |
| *C23C 18/44* | (2006.01) |
| *C23C 18/02* | (2006.01) |
| *C23F 3/04* | (2006.01) |
| *H01L 21/02* | (2006.01) |
| *H05K 3/42* | (2006.01) |
| *H01L 21/288* | (2006.01) |
| *H01L 21/67* | (2006.01) |
| *H01L 21/768* | (2006.01) |
| *H01L 21/285* | (2006.01) |
| *H05K 3/18* | (2006.01) |

(52) U.S. Cl.
CPC .......... *C23C 18/08* (2013.01); *C23C 18/1608* (2013.01); *C23C 18/168* (2013.01); *C23C 18/1632* (2013.01); *C23C 18/1675* (2013.01); *C23C 18/1683* (2013.01); *C23C 18/34* (2013.01); *C23C 18/40* (2013.01); *C23C 18/44* (2013.01); *C23C 18/52* (2013.01); *C23C 18/54* (2013.01); *C23F 3/04* (2013.01); *H01L 21/02074* (2013.01); *H01L 21/288* (2013.01); *H01L 21/28562* (2013.01); *H01L 21/6723* (2013.01); *H01L 21/76846* (2013.01); *H01L 21/76849* (2013.01); *H05K 3/422* (2013.01); *H05K 3/187* (2013.01)

(58) Field of Classification Search
USPC ............. 427/97.9, 99.5, 304, 305, 306, 437, 427/443.1, 438
See application file for complete search history.

(56) References Cited

OTHER PUBLICATIONS

D. Wu, D. J. Solanki, A. Joi, Y. Dordi, N. Dole, D. Litvnov, and S. R. Brankovic, "Pb Monolayer Mediated Thin Film Growth of Cu and Co: Exploring Different Concepts", Journal of the Electrochemical Society, published Aug. 31, 2018, 166:D3013-D3021.

"International Search Report and Written Opinion Issued in PCT Application No. PCT/US2018/045591", dated Nov. 26, 2018, 15 Pages.

Ambrozik, S. et al., "The Deposition of Pt via Electroless Surface Limited Redox Replacement", Electrochimica Acta 169, Apr. 9, 2015, pp. 248-255.

Gebregziabiher, Daniel K. et al., "Electrochemical atomic layer deposition of copper nanofilms on ruthenium", Journal of Crystal Growth 312, Dec. 11, 2009, pp. 1271-1276.

* cited by examiner

SELECTIVE ELECTROLESS ELECTROCHEMICAL ATOMIC LAYER DEPOSITION IN AN AQUEOUS SOLUTION WITHOUT EXTERNAL VOLTAGE BIAS

CROSS-REFERENCE TO RELATED APPLICATIONS

This application claims the benefit of U.S. Provisional Application No. 62/545,180, filed on Aug. 14, 2017. The disclosure of the above application is incorporated herein by reference in its entirety.

FIELD

The present disclosure relates to substrate processing systems, and more particularly to substrate processing systems for selective electroless electrochemical atomic layer deposition (electroless e-ALD) in an aqueous environment without supplying an external voltage bias.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Atomic layer deposition (ALD) may be used to deposit a monolayer of film on a substrate during each ALD cycle. During an ALD cycle, a surface of the substrate is exposed to a first precursor gas and provided with an externally supplied electrical bias voltage during a first period. The processing chamber is then evacuated and the substrate is exposed to a second precursor gas during a second period. The precursor gases react with the surface of the substrate in a self-limiting way. The reaction terminates once all the reactive sites on the surface are consumed.

ALD is a promising technology for future technology nodes since ALD controls thickness to the atomic level. However, there are some disadvantages with using ALD to deposit metals. For example, ALD of metal typically involves organic contaminants within the film, which reduces conductivity. There is also a lack of inherent selectivity between the metal and exposed dielectric film. Furthermore, precursor cost is relatively high.

Electroless deposition overcomes some of the disadvantages relating to selectivity, the quality of metal film and precursor cost. However, electroless deposition lacks atomic level thickness control, which is one of the key advantages of ALD. Additionally, it is challenging to deposit noble metals such as ruthenium (Ru) and platinum (Pt) using ALD.

SUMMARY

A method of performing electroless electrochemical atomic layer deposition is provided and includes: providing a substrate including an exposed upper metal layer; exposing the substrate to a first precursor solution to create a sacrificial metal monolayer on the exposed upper metal layer via underpotential deposition, where the first precursor solution is an aqueous solution including a reducing agent; subsequent to the forming of the sacrificial metal monolayer, rinsing the substrate; subsequent to the rinsing of the substrate, exposing the substrate to a second precursor solution to replace the sacrificial metal monolayer with a first deposition layer; and subsequent to replacing the sacrificial metal monolayer with the first deposition layer, rinsing the substrate. The exposure of the substrate to the first precursor solution and the exposure of the substrate to the second precursor solution are electroless processes.

In other features, the first precursor solution includes zinc sulfate. In other features, the first precursor solution includes a metal salt, carboxylic acid, the reducing agent, and a pH adjuster. In other features, the metal salt includes zinc sulfate and the pH adjuster includes ammonium hydroxide.

In yet other features, the first precursor solution includes a metal salt, carboxylic acid, the reducing agent, and a pH adjuster. The metal salt includes zinc sulfate. The reducing agent includes titanium. The pH adjuster includes ammonium hydroxide. In other features, the first precursor solution includes: a first predetermined amount of a first mixture of zinc sulfate and ammonium hydroxide; a second predetermined amount of a second mixture of titanium chloride and ammonium citrate; and a third predetermined amount of ammonium hydroxide in addition to the ammonium hydroxide included in the first mixture. In other features, the sacrificial metal monolayer includes zinc. The reducing agent includes titanium.

In other features, the second precursor solution includes an aqueous solution of salt and metal ions. In still other features, the second precursor solution includes copper sulfate. In other features, the second precursor solution includes ruthenium nitrosyl sulfate or ruthenium nitrosyl chloride. In other features, the second precursor solution includes chloroplatinic acid.

In other features, the second precursor solution includes a metal salt. In other features, the metal salt includes copper, rutenhium or platinum. In other features, the second precursor solution includes a surface limited redox replacement electrolyte. In other features, the surface limited redox replacement electrolyte includes copper sulfate, citric acid, and sulfuric acid. In other features, the first deposition layer includes copper, cobalt, ruthenium, or platinum.

In other features, the method further includes: detecting at least one of a current level or a voltage at a surface of the exposed upper metal layer via a probe; and based on the at least one of the current level or the voltage, adjusting at least one of a pH level, a concentration of the first precursor solution, or a temperature to maintain the at least one of the current level within a first predetermined range or the voltage within a second predetermined range for electroless electrochemical atomic layer deposition of the sacrificial metal monolayer.

In other features, the method includes, based on the at least one of the current level or the voltage, adjusting the pH level to be between 9 and 10, where the pH level is a pH level of the first precursor solution. In other features, the first precursor solution includes titanium chloride and zinc sulfate. The pH level, an amount of the titanium chloride, an amount of the zinc sulfate and the temperature are adjusted to maintain the at least one of the current level within the first predetermined range or the voltage within the second predetermined range for electroless electrochemical atomic layer deposition of the sacrificial metal monolayer.

A substrate processing system is also provided that includes: a processing chamber; a substrate support disposed in the processing chamber and configured to hold a substrate, where the substrate includes an exposed upper metal layer; at least one injector configured to receive a first precursor solution and a second precursor solution; and a system controller. The substrate processing system is configured to: perform electroless electrochemical atomic layer deposition including exposing the substrate to the first precursor solution to create a sacrificial metal monolayer on the exposed upper metal layer via underpotential deposition, where the first precursor solution is an aqueous solution including a reducing agent; subsequent to the forming of the sacrificial metal monolayer, rinse the substrate; subsequent to the rinsing of the substrate, expose the substrate to the second precursor solution to replace the sacrificial metal monolayer with a first deposition layer; and subsequent to replacing the sacrificial metal monolayer with the first deposition layer, rinse the substrate. The exposure of the substrate to the second precursor solution is an electroless process.

In other features, an interior of the processing chamber is at an ambient temperature, at least partially filled with nitrogen and void of oxygen. In other features, the first precursor solution includes a metal salt, carboxylic acid, the reducing agent, and a pH adjuster. In other features, the metal salt includes zinc sulfate and the pH adjuster includes ammonium hydroxide.

In other features, the first precursor solution includes a metal salt, carboxylic acid, the reducing agent, and a pH adjuster. The metal salt includes zinc sulfate. The reducing agent includes titanium. The pH adjuster includes ammonium hydroxide.

In other features, the first precursor solution includes: a first predetermined amount of a first mixture of zinc sulfate and ammonium hydroxide; a second predetermined amount of a second mixture of titanium chloride and ammonium citrate; and a third predetermined amount of ammonium hydroxide in addition to the ammonium hydroxide included in the first mixture.

In other features, the sacrificial metal monolayer includes zinc. In other features, the second precursor solution includes an aqueous solution of salt and metal ions. In other features, the second precursor solution includes copper sulfate, ruthenium nitrosyl sulfate, ruthenium nitrosyl chloride or chloroplatinic acid. In other features, the second precursor solution includes a surface limited redox replacement electrolyte. In other features, the surface limited redox replacement electrolyte includes copper sulfate, citric acid, and sulfuric acid. In other features, the first deposition layer includes copper, cobalt, ruthenium, or platinum.

In other features, the substrate processing system further includes at least one probe configured to measure at least one of a current level or a voltage at a surface of the exposed upper metal layer. The system controller is configured to, based on the at least one of the current level or the voltage, adjust at least one of a pH level, a concentration of the first precursor solution, or a temperature to maintain the at least one of the current level within a first predetermined range or the voltage within a second predetermined range for electroless electrochemical atomic layer deposition of the sacrificial metal monolayer.

In other features, the system controller is configured to, based on the at least one of the current level or the voltage, adjusting the pH level to be between 9 and 10, wherein the pH level is a pH level of the first precursor solution. In other features, the first precursor solution includes titanium chloride and zinc sulfate. The system controller is configured to adjust the pH level, an amount of the titanium chloride, an amount of the zinc sulfate and the temperature to maintain the at least one of the current level within the first predetermined range or the voltage within the second predetermined range for electroless electrochemical atomic layer deposition of the sacrificial metal monolayer.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

A method according to the present disclosure performs electroless e-ALD of a desired metal monolayer on an underlying metal layer in an aqueous solution without supplying an external voltage bias. The method includes exposing a substrate to a first precursor solution. The first precursor solution deposits a sacrificial metal monolayer on a metal-containing layer of the substrate.

In some examples, the first precursor solution includes a metal salt. The metal in the metal salt is less noble than the desired metal that replaces the sacrificial metal monolayer during the subsequent step. In some examples, the sacrificial metal monolayer includes zinc (Zn) and the desired metal (such as copper (Cu), cobalt (Co), ruthenium (Ru), platinum (Pt) or other metal) is a more noble metal than Zn. While Zn is disclosed, the sacrificial metal monolayer can include any metal that is less noble than the desired metal. In some examples, the first precursor solution is an aqueous solution including a metal salt, carboxylic acid, a reducing agent, and/or a pH adjuster.

After being exposed to the first precursor solution for a predetermined period, the substrate is rinsed. In some examples, the substrate is rinsed with deionized water (DIW). Then, the substrate is exposed to a second precursor solution for a second predetermined period. The second precursor solution replaces the sacrificial metal monolayer with the desired metal monolayer.

During exposure to the second precursor solution, the sacrificial metal monolayer is galvanically replaced with the desired metal monolayer. In some examples, the desired metal monolayer is selected from a group consisting of copper (Cu), cobalt (Co), ruthenium (Ru), platinum (Pt) or other metal. The substrate may be rinsed again and the process may be repeated one or more times to deposit additional monolayers of the desired metal.

The process is highly controlled and selective. Deposition of the sacrificial metal monolayer occurs only on the underlying metal layer and is limited to one monolayer. The desired metal layer replaces the sacrificial monolayer and is therefore also selective.

The process can be thought of as electroless deposition with atomic layer deposition (ALD) level precision (or electroless electrochemical atomic layer deposition (electroless e-ALD)). Electroless deposition, while selective and providing high quality metal film, has a deposition rate that ranges from few angstroms to hundreds of angstroms. Deposition thickness is difficult to control if a film thickness of a few nanometers is required.

Figure 1:
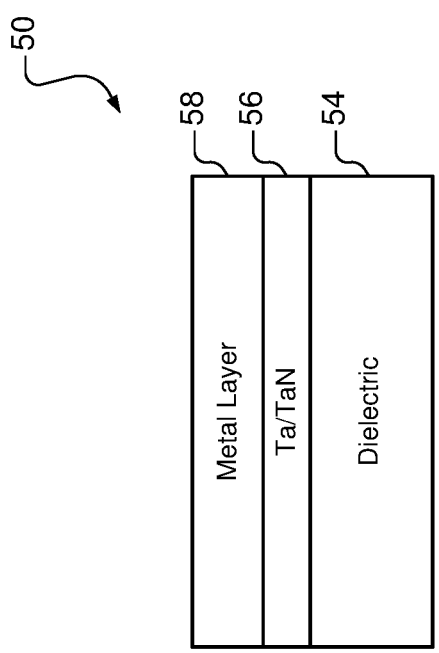
FIG. 1 illustrates an example of a substrate including a dielectric layer, a barrier layer and a metal layer.

Referring now to FIGS. 1-5, controlled deposition of a desired metal monolayer on an underlying metal layer is shown. In FIG. 1, a substrate 50 is shown including a dielectric layer 54, a barrier layer 56 and a metal layer 58. In some examples, the barrier layer 56 includes one or more tantalum (Ta) and/or tantalum nitride (TaN) layers. In some examples, the metal layer 58 includes copper (Cu), ruthenium (Ru) or other metal. The desired metal monolayer is deposited on the metal layer 58 as is described further below.

Figure 2:
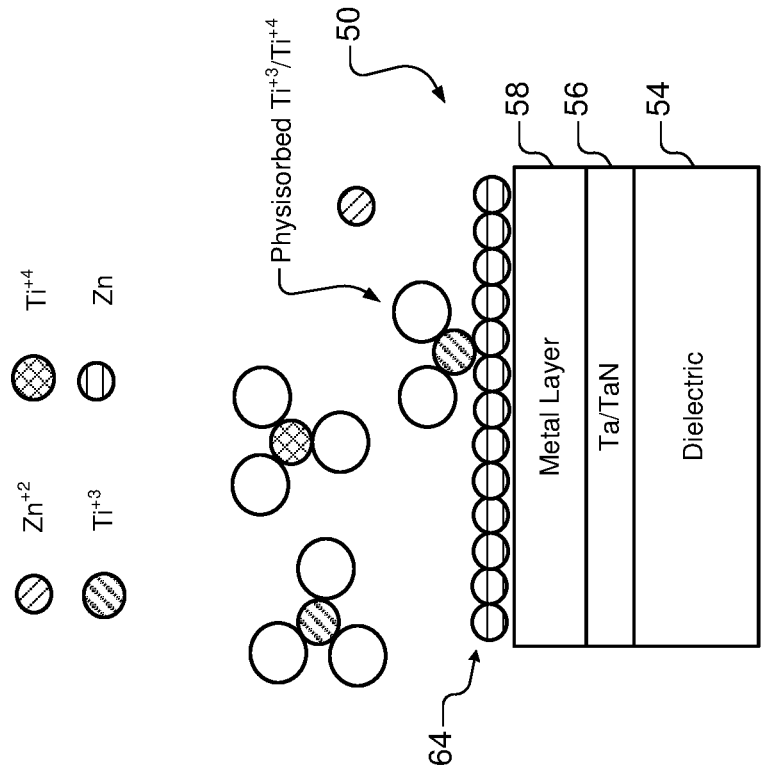
FIG. 2 illustrates an example of the substrate during exposure to a first precursor solution according to the present disclosure.
Figure 3:
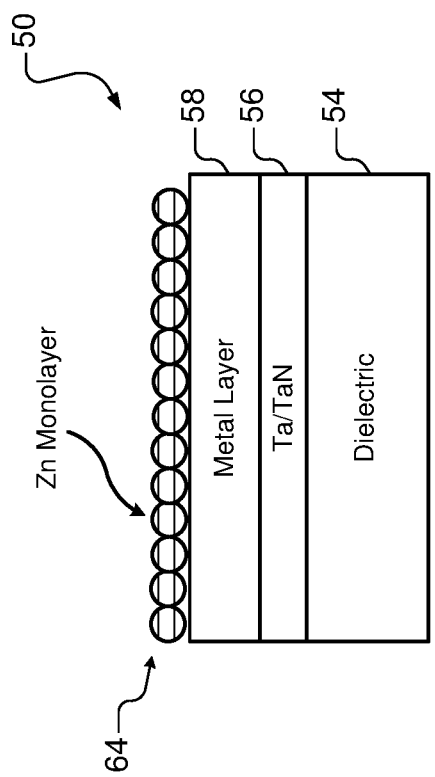
FIG. 3 illustrates an example of the substrate with a zinc monolayer after exposure to the first precursor solution and rinsing according to the present disclosure.

In FIGS. 2-3, the substrate 50 is shown being exposed to a first precursor solution. The first precursor solution deposits a sacrificial metal monolayer 64 as shown in FIG. 2 during a self-limiting process. The sacrificial metal monolayer 64 is selectively deposited on the metal layer 58 and not on layers 54, 56. This is because layers 54, 56 are not catalytically reactive. FIG. 3 shows the sacrificial metal monolayer 64 after rinsing.

In some examples, the first precursor solution includes an aqueous solution including a metal salt, carboxylic acid (R—COOH), a reducing agent, and/or a pH adjuster. The metal in the metal salt is less noble than the desired metal that replaces the sacrificial metal layer during a subsequent step.

In some examples, the metal salt includes zinc sulfate ($ZnSO_4$) and the sacrificial metal monolayer includes zinc (Zn). In some examples, the pH adjuster includes ammonium hydroxide ($NH_4OH$), although other pH adjusters may be used. In some examples, the pH adjuster adjusts the pH level of the solution to a range between 9 and 10. In some examples, the pH adjuster adjusts the pH level of the solution to be in a range between 9.5 and 10.

In some examples, the reducing agent in the aqueous solution has just enough thermodynamic driving force to deposit one monolayer of the sacrificial metal but not multiple layers or a bulk material layer (such as during electroless deposition). This process of depositing a monolayer is also referred to as underpotential deposition (UPD), which provides self-limiting growth. UPD refers to the electrodeposition of a metal species at a potential that is less negative than an equilibrium potential for reduction of the metal species. The equilibrium potential for the reduction of a metal is the potential at which the metal will deposit onto itself. UPD refers to when a metal can deposit onto another material more easily than the metal can deposit onto itself. In some examples, the thermodynamic driving force is controlled by the concentration of the reducing agent and/or the pH of the first precursor solution. In some examples, the reducing agent is a metal ion reducing agent. In some examples, the reducing agent includes titanium (III) chloride $TiCl_3$, although other reducing agents can be used. In some examples, the carboxylic acid includes citric acid.

Figure 4:
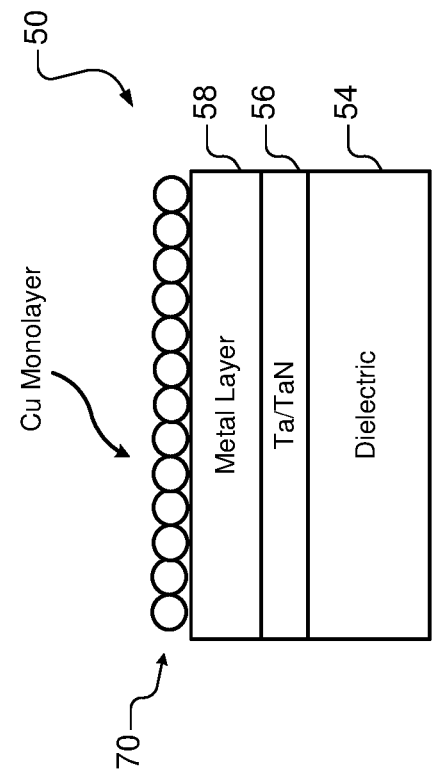
FIG. 4 illustrates an example of the substrate during exposure to a second precursor solution, which replaces the zinc monolayer with a monolayer of a desired metal according to the present disclosure.
Figure 5:
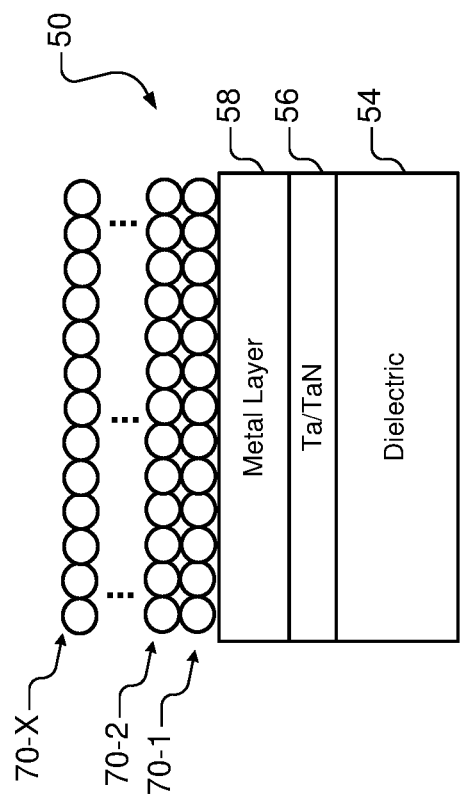
FIG. 5 illustrates an example of the substrate after deposition of additional monolayers of the desired metal according to the present disclosure.

Referring now to FIGS. 4-5, the substrate 50 is exposed to a second precursor solution. The second precursor solution replaces the sacrificial metal monolayer with a monolayer of a desired metal 70. The second precursor solution is an aqueous solution including salt and metal ions (collectively referred to as a "metal salt") corresponding to the desired metal. In some examples, the aqueous solution includes copper sulfate ($CuSO_4$) when the desired metal is copper (Cu). In some examples, the aqueous solution includes ruthenium nitrosyl sulfate or ruthenium nitrosyl chloride ($Ru(NO)Cl_5$) when the desired metal is ruthenium (Ru). In some examples, the aqueous solution includes chloroplatinic acid ($H_2PtCl_6$ or $H_2PtCl_4$) when the desired metal is platinum (Pt).

Figure 6:
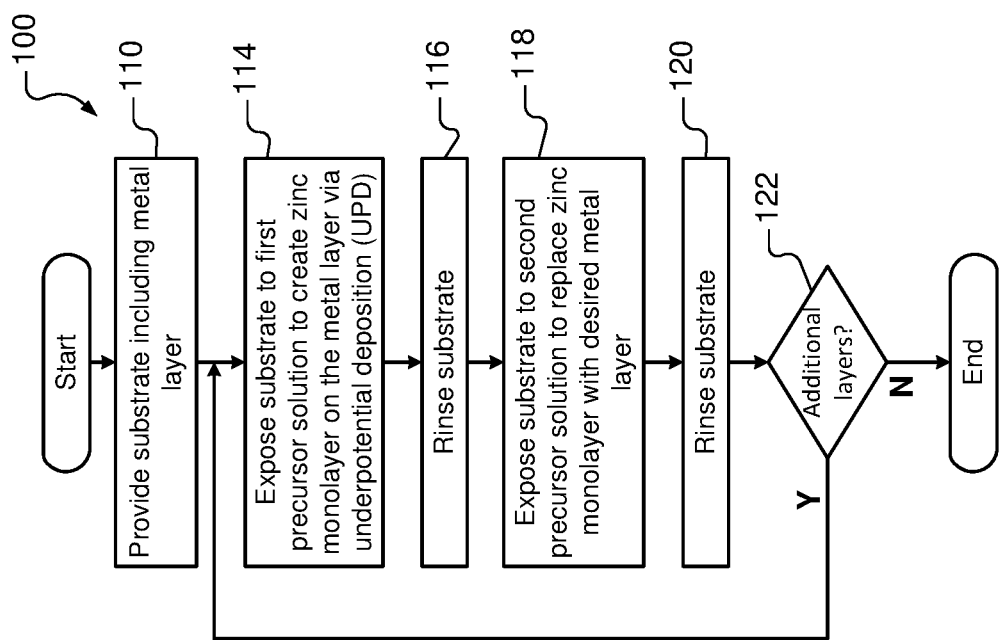
FIG. 6 illustrates an example of a method for depositing monolayers of the desired metal using selective electroless electrochemical ALD (electroless e-ALD) in an aqueous solution according to the present disclosure.

Referring now to FIG. 6, a method 100 for depositing monolayers of the desired metal on a metal layer using selective electroless e-ALD in an aqueous solution is shown. The method 100 may be implemented using the substrate processing system 200 of FIG. 9.

At 110, a substrate is provided that includes an exposed metal containing layer. At 114, the substrate is exposed to a first precursor solution for a predetermined period. The first precursor solution deposits the sacrificial metal monolayer on the underlying metal layer via under potential deposition (UPD). Operation 114 is an electroless operation that includes a chemical reaction, which creates a voltage potential at the surface of the exposed metal containing layer. In one embodiment, a 102 milliliter (ml) electroless zinc UPD recipe is used and includes: a 92 ml mixture of 1 millimolar (mM) of $ZnSO_4$ and 0.2 molar (M) $NH_4OH$; a 8.1 ml mixture of 0.03M $TiCl_3$ and 0.09M ammonium citrate $C_6H_{17}N_3O_7$; and 2 ml of $NH_4OH$. The amounts, durations of injection, compositions, flow rates, injection timing of gases and/or fluids supplied to a corresponding processing chamber (e.g., the processing chamber 202 of FIG. 9) may be set and/or adjusted based on signals received from the probes and/or signals received from a same or similar previously performed process using voltages and/or currents stored in memory. The memory may be in the system controller 260 of FIG. 9 or located elsewhere.

The amounts, durations of injection, compositions, flow rates, and/or injection timing of gases and/or fluids may be set and/or adjusted based on voltages and/or current levels measured by one or more probes on the metal layer 58, as further described below. In one embodiment, the amounts, durations of injection, compositions, flow rates, and/or injection timing of gases and/or fluids pH levels, and temperatures are adjusted such that the voltage potentials and/or current levels measured across the top surface of the metal layer 58 are within a predetermined voltage potential range and/or a predetermined current level range. The voltage potentials and current levels may also be adjusted by setting and/or adjusting: the pH levels as described herein; and/or temperatures within the processing chamber and/or corresponding substrate support. Adjusting the temperatures in the processing chamber and/or in the substrate support adjusts the temperatures of the substrate. In an embodiment, the voltage potential range is (i) between a first voltage potential (e.g., −1.3V) and a second voltage potential (e.g., −0.7V), and (ii) below a standard calomel electrode (SCE) potential. The first voltage potential is greater in magnitude than the reversible potential for Zn deposition. The second voltage potential is set based on the material of the metal layer on which the electroless e-ALD is being performed.

Figure 10:
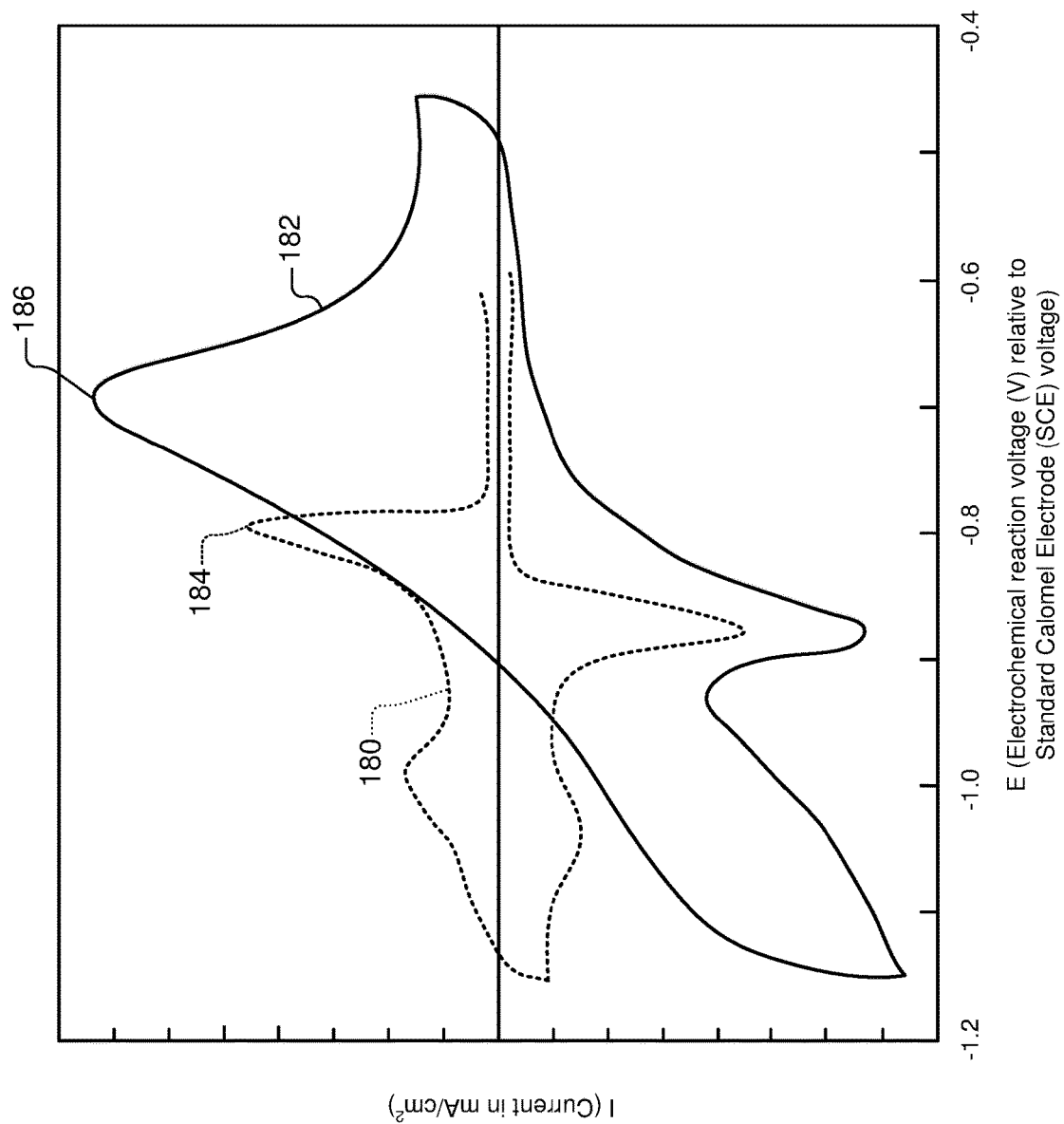
FIG. 10 is an example plot of current versus voltage potentials curves for a first substrate experiencing zinc electroless e-ALD on a copper layer and a second substrate experiencing zinc electroless e-ALD on a ruthenium layer In the drawings, reference numbers may be reused to identify similar and/or identical elements.

FIG. 10 shows an example plot of current versus voltage potentials curves 180, 182 for a first substrate experiencing Zn electroless e-ALD on a Cu metal layer and a second substrate experiencing Zn electroless e-ALD on a Ru metal layer. The voltage potentials are relative to the SCE potential. Different amounts of UPD occur depending on the voltage potentials at the top surface of the metal layer on which electroless B-ALD is being performed. For example, to provide the appropriate voltage potentials a particular reducing agent and a particular amount of the reducing agent is used. If too much reducing agent is used, the voltage potentials increase in magnitude and drop below the predetermined voltage potential range. If the voltage potentials are too low, then hydrogen evolution can occur. This is avoided by maintaining the voltage potentials within the predetermined voltage potential range. If the voltage potentials decrease in magnitude and are above the predetermined voltage potential range, then deposition decreases and/or ceases to occur due to the low amount of, for example, a Ti electrolyte (or other electrolyte). As an example, the measured voltage potentials (or voltage potentials across the top surface of the metal layer 58) may be adjusted by adjusting the pH levels, the amount of $TiCl_3$, the amount of $ZnSO_4$, and/or the temperatures of the metal layer 58. At the peaks 184, 186, electroless e-ALD is occurring at a maximum rate.

Once the top surface of the metal layer 58 is saturated with Zn, then no more Zn deposition can occur. The more Zn supplied, the shorter the period of electroless B-ALD. The system controller 160 may control when electroless e-ALD ceases by adjusting the amounts, durations of injection, compositions, flow rates, and/or injection timing of gases and/or fluids supplied during operation 114. This may include adjusting the pH levels as described herein and/or the temperatures within the processing chamber and/or corresponding substrate support to adjust temperatures of the substrate. At 116, the processing chamber may be evacuated and the substrate is rinsed when electroless e-ALD has ceased and/or when a predetermined amount of electroless e-ALD has occurred to provide a monolayer.

At 118, the substrate is exposed to a second precursor solution. The second precursor solution selectively replaces the sacrificial metal monolayer with a monolayer of the desired (or predetermined) metal. As an example, the second solution may include a Cu surface limited redox replacement (SLRR) electrolyte, which may include 0.4M $CuSO_4$, 0.8M citric acid $C_6H_8O_7$ and 0.9M sulfuric acid $H_2SO_4$. During the first iteration of the operations 110-122, the metal layer remaining after the replacement of the sacrificial metal monolayer with the monolayer of the desired (or predetermined) metal may be referred to as a first deposition layer. A next iteration of operations 110-122 may provide a second deposition layer. Any number of deposition layers may be formed.

At 120, the substrate is rinsed. At 122, if additional layers need to be deposited, the method returns to 114. Otherwise the method ends.

Figure 7:
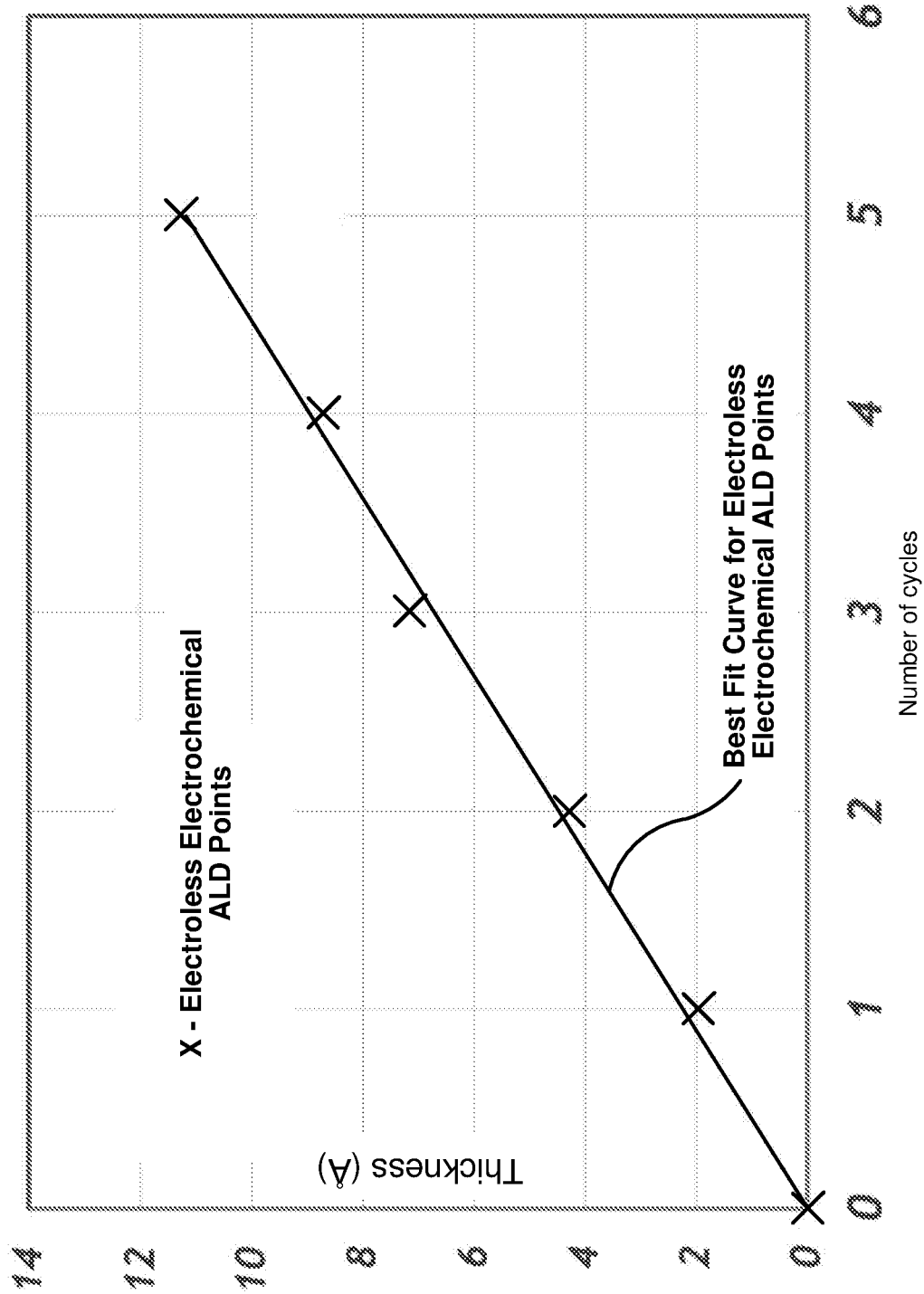
FIG. 7 is a graph illustrating thickness as a function of deposition cycles for electroless deposition according to the prior art and electroless e-ALD according to the present disclosure.

Referring now to FIG. 7, a graph illustrates thickness as a function of the number of deposition cycles. After one cycle, electroless deposition is a continuous process where thickness less than 100 Angstroms is difficult to control. In contrast, selective electroless e-ALD in an aqueous solution according to the present disclosure deposits a monolayer during each deposition cycle having a thickness of approximately 2 Angstroms.

Figure 8:
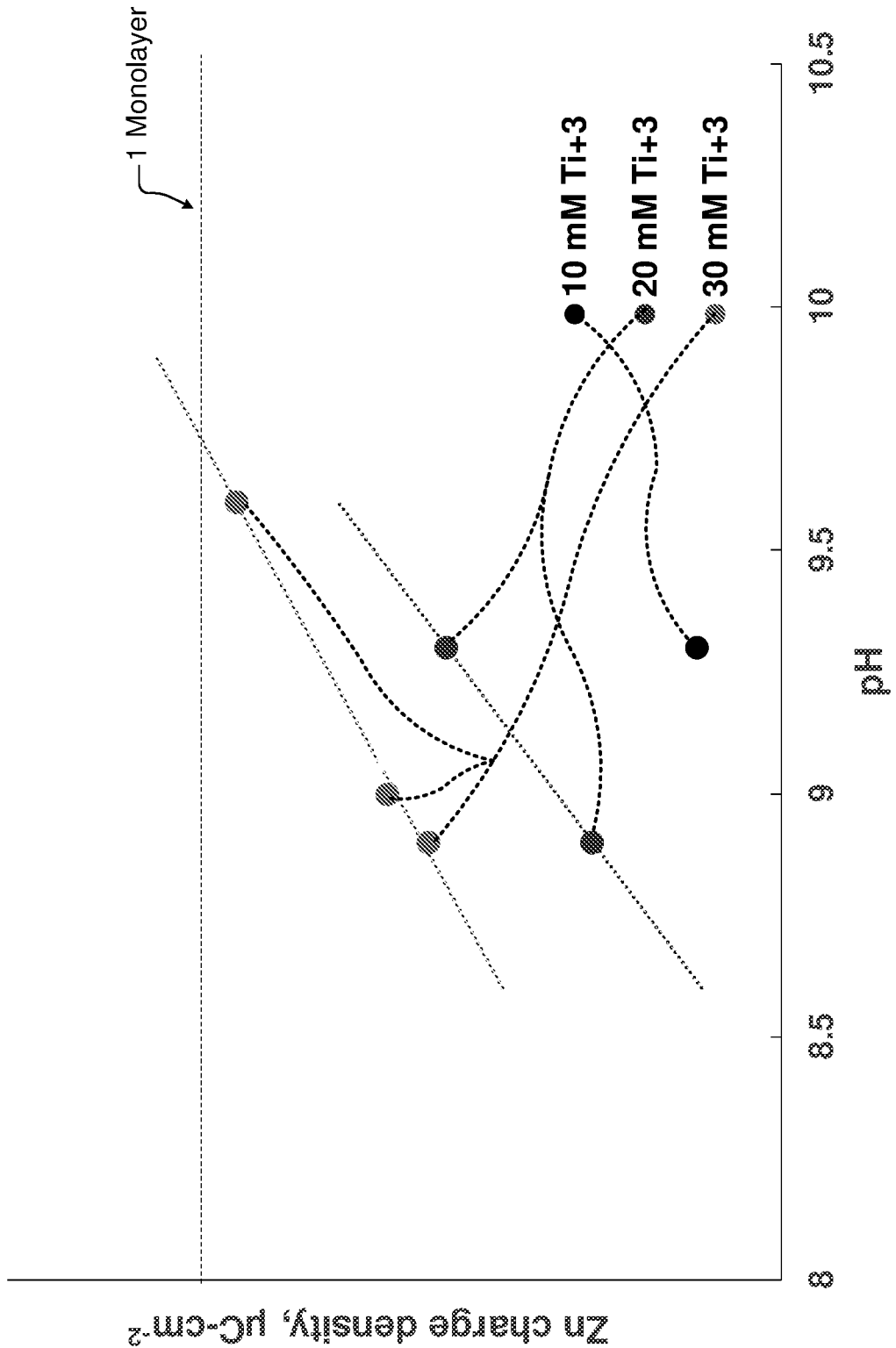
FIG. 8 is a graph illustrating zinc charge density as a function of pH and $Ti^{+3}$ concentration.

Referring now to FIG. 8, a graph illustrates zinc charge density as a function of pH and $Ti^{+3}$ concentration. As can be seen, increasing concentration of the reducing agent tends to improve coverage of the monolayer on the underlying metal layer up to a predetermined concentration. Additionally, the pH of the aqueous solution also impacts the coverage of the monolayer on the underlying metal layer.

The method described herein is a cyclic process that can deposit metal film selectively on metal approximately one atomic layer at a time while maintaining high quality film and using inexpensive aqueous precursors. Moreover, due to the cyclic nature of the process, it is possible to deposit noble metals (e.g. Ru, Pt) that are challenging for a typical electroless deposition process. The electroless e-ALD method described herein combines scaling flexibility of ALD and process/manufacturing flexibility of electroless deposition.

In some examples, the method described herein is performed at or near room temperature. The method can be performed using wet deposition. Co-deposition of alloys may also be performed such as ultra-thin ferromagnets for spin valves. The method also enables doping of conductor metal with Zn which has been shown to provide improved adhesion to dielectric materials.

Figure 9:
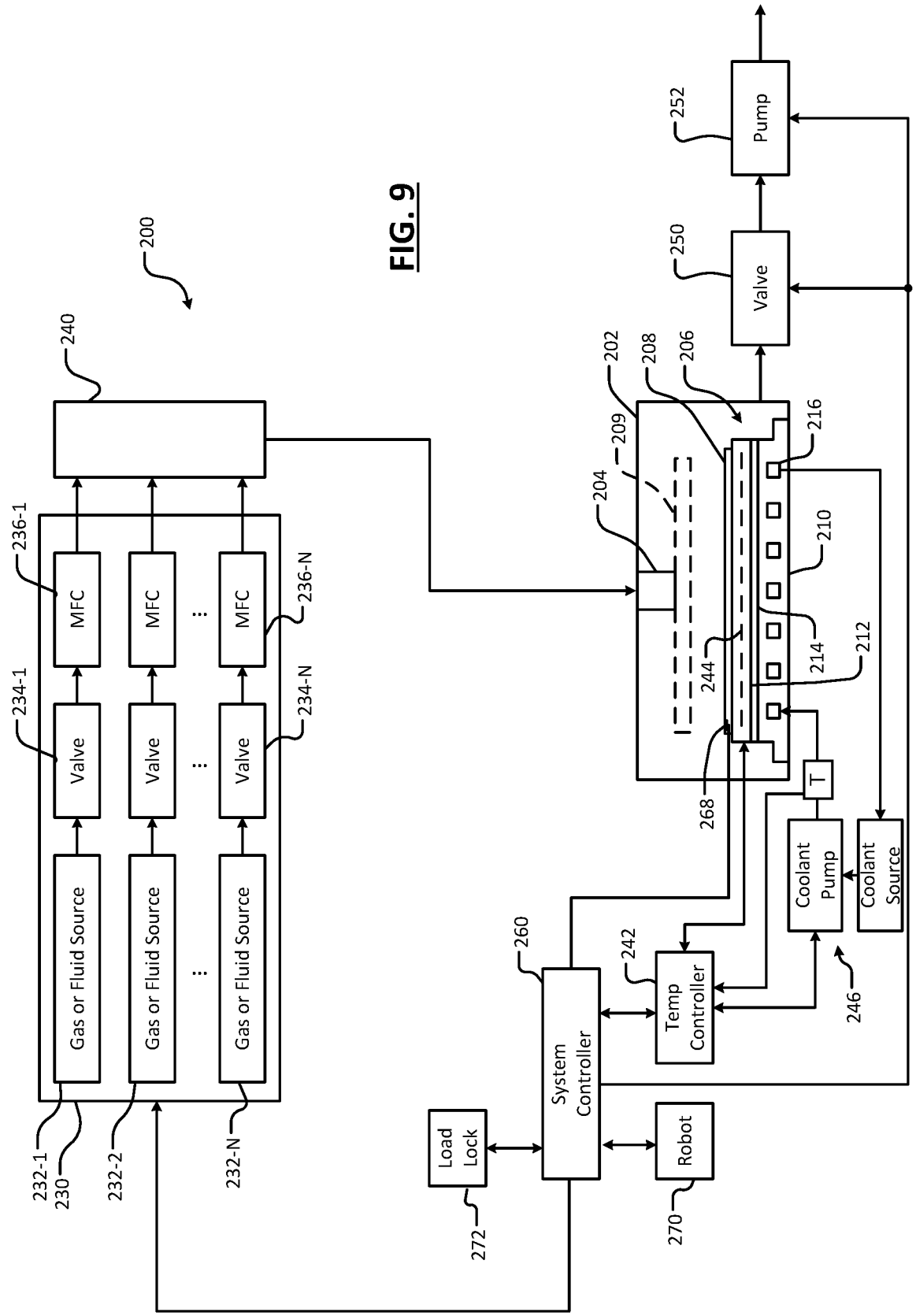
FIG. 9 is a functional block diagram of an example of a substrate processing system 200 for performing selective electroless e-ALD.

FIG. 9 shows an example substrate processing system 200 for performing selective electroless e-ALD is shown. The substrate processing system 200 includes a processing chamber 202 that encloses some components of the substrate processing chamber 202. The substrate processing chamber 202 includes one or more injectors (an injector 204 is shown) and a substrate support 206 (e.g., an electrostatic chuck). During operation, a substrate 208 is arranged on the substrate support 206. The substrate processing chamber 202 may be a nitrogen ambient chamber (or chamber filled at least partially with nitrogen and at an ambient temperature) providing a controlled environment with no oxygen.

For example only, the injector introduces and distributes process gases and fluids, such as deionized water, a carboxylic acid, a reducing agent, a pH adjuster, a first precursor solution, a second precursor solution, etc. The injector 204 may be connected to a top surface of the processing chamber and be directed at the substrate 208. The injector 204 may be connected to a showerhead 209, which may disperse the gases and/or fluids over an upper surface of the substrate 208.

The substrate support 206 includes a baseplate 210. The baseplate 210 supports a heating plate 212, which may correspond to a ceramic multi-zone heating plate. A thermal resistance layer 214 may be arranged between the heating plate 212 and the baseplate 210. The baseplate 210 may include one or more coolant channels 216 for flowing coolant through the baseplate 210.

A gas and fluid delivery system 230 includes one or more gas or fluid sources 232-1, 232-2, ..., and 232-N (collectively gas or fluid sources 232), where N is an integer greater than zero. The gas sources supply one or more deposition precursors and mixtures thereof. The gas precursors may include precursor gases, purge gas and/or other gases. Vaporized precursor may also be used. The gas or fluid sources 232 are connected by valves 234-1, 234-2, ..., and 234-N (collectively valves 234) and mass flow controllers 236-1, 236-2, . . . , and 236-N (collectively mass flow controllers 236) to a manifold 240. An output of the manifold 240 is fed to the processing chamber 202. For example only, the output of the manifold 240 is fed to the injector 204, which is shown as a showerhead.

A temperature controller 242 may be connected to a plurality of thermal control elements (TCEs) 244 arranged in the heating plate 212. For example, the TCEs 244 may include, but are not limited to, respective macro TCEs corresponding to each zone in a multi-zone heating plate and/or an array of micro TCEs disposed across multiple zones of a multi-zone heating plate. The temperature controller 242 may be used to control the TCEs 244 to control a temperature of the substrate support 206 and the substrate 208.

The temperature controller 242 may communicate with a coolant assembly 246 to control coolant flow through the channels 216. For example, the coolant assembly 246 may include a coolant pump and reservoir. The temperature controller 242 operates the coolant assembly 246 to selectively flow the coolant through the channels 216 to cool the substrate support 206.

A valve 250 and pump 252 may be used to evacuate reactants from the processing chamber 202. A system controller 260 may be used to control components of the substrate processing system 200. A robot 270 may be used to deliver substrates onto, and remove substrates from, the substrate support 206. For example, the robot 270 may transfer substrates between the substrate support 206 and a load lock 272. Although shown as separate controllers, the temperature controller 242 may be implemented within the system controller 260. The temperature controller 242 may be further configured to implement one or more models to estimate temperatures of the substrate support 206 according to the principles of the present disclosure.

One or more probes (an example probe 268 is shown) may be included to measure current and/or voltages at a surface of the substrate 208. Although a single example probe 268 is shown, any number of probes may be included. In one embodiment, an array of probes are included. The probes may be placed on the substrate 208, such as on the metal layer 58 of FIG. 2 or may be incorporated in the metal layer 58. The system controller 260 may receive current and/or voltage signals from the one or more probes. The system controller 260 may then control amounts, compositions, durations of injection, flow rates, and/or injection timing of gases and/or fluids supplied to the processing chamber 202 based on signals received from the probes. This may include adjusting the pH levels as described herein and/or the temperatures within the processing chamber and/or corresponding substrate support and thus the temperatures of the substrate. The system controller 260 may also adjust timing of exhausting the gases and/or fluids from the processing chamber 202 based on the signals received from the probes.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of performing electroless electrochemical atomic layer deposition comprising:
   providing a substrate including an exposed upper metal layer;
   exposing the substrate to a first precursor solution to create a sacrificial metal monolayer on the exposed upper metal layer via underpotential deposition, wherein the first precursor solution is an aqueous solution including a reducing agent;
   subsequent to the forming of the sacrificial metal monolayer, rinsing the substrate;
   subsequent to the rinsing of the substrate, exposing the substrate to a second precursor solution to replace the sacrificial metal monolayer with a first deposition layer; and
   subsequent to replacing the sacrificial metal monolayer with the first deposition layer, rinsing the substrate,
   wherein the exposure of the substrate to the first precursor solution and the exposure of the substrate to the second precursor solution are electroless processes.

2. The method of claim 1, wherein the first precursor solution includes zinc sulfate.

3. The method of claim 1, wherein the first precursor solution includes a metal salt, carboxylic acid, the reducing agent, and a pH adjuster.

4. The method of claim 3, wherein:
   the metal salt includes zinc sulfate; and
   the pH adjuster includes ammonium hydroxide.

5. The method of claim 1, wherein:
   the first precursor solution includes a metal salt, carboxylic acid, the reducing agent, and a pH adjuster;
   the metal salt includes zinc sulfate;
   the reducing agent includes titanium; and
   the pH adjuster includes ammonium hydroxide.

6. The method of claim 1, wherein the first precursor solution includes:
   a first predetermined amount of a first mixture of zinc sulfate and ammonium hydroxide;
   a second predetermined amount of a second mixture of titanium chloride and ammonium citrate; and
   a third predetermined amount of ammonium hydroxide in addition to the ammonium hydroxide included in the first mixture.

7. The method of claim 1, wherein the sacrificial metal monolayer includes zinc.

8. The method of claim 1, wherein the reducing agent includes titanium.

9. The method of claim 1, wherein the second precursor solution includes an aqueous solution of salt and metal ions.

10. The method of claim 1, wherein the second precursor solution includes copper sulfate.

11. The method of claim 1, wherein the second precursor solution includes ruthenium nitrosyl sulfate or ruthenium nitrosyl chloride.

12. The method of claim 1, wherein the second precursor solution includes chloroplatinic acid.

13. The method of claim 1, wherein the second precursor solution includes a metal salt.

14. The method of claim 13, wherein the metal salt includes copper, rutenhium or platinum.

15. The method of claim 1, wherein the second precursor solution includes a surface limited redox replacement electrolyte.

16. The method of claim 15, wherein the surface limited redox replacement electrolyte includes copper sulfate, citric acid, and sulfuric acid.

17. The method of claim 1, wherein the first deposition layer includes copper, cobalt, ruthenium, or platinum.

18. The method of claim 1, further comprising:
   detecting at least one of a current level or a voltage at a surface of the exposed upper metal layer via a probe; and
   based on the at least one of the current level or the voltage, adjusting at least one of a pH level, a concentration of the first precursor solution, or a temperature to maintain the at least one of the current level within a first predetermined range or the voltage within a second predetermined range for electroless electrochemical atomic layer deposition of the sacrificial metal monolayer.

19. The method of claim 18, comprising, based on the at least one of the current level or the voltage, adjusting the pH level to be between 9 and 10, wherein the pH level is a pH level of the first precursor solution.

20. The method of claim 18, wherein:
the first precursor solution includes titanium chloride and zinc sulfate; and
the pH level, an amount of the titanium chloride, an amount of the zinc sulfate and the temperature are adjusted to maintain the at least one of the current level within the first predetermined range or the voltage within the second predetermined range for electroless electrochemical atomic layer deposition of the sacrificial metal monolayer.

* * * * *